United States Patent
Lee

(10) Patent No.: US 7,719,904 B2
(45) Date of Patent: May 18, 2010

(54) DATA INPUT CIRCUIT FOR A SEMICONDUCTOR MEMORY CAPABLE OF ADAPTING TO A PHASE SKEW BETWEEN A DATA STROBE SIGNAL AND AN EXTERNAL CLOCK SIGNAL

(75) Inventor: Kang-Youl Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 73 days.

(21) Appl. No.: 12/169,555

(22) Filed: Jul. 8, 2008

(65) Prior Publication Data
US 2009/0168547 A1    Jul. 2, 2009

(30) Foreign Application Priority Data
Dec. 28, 2007   (KR) .................. 10-2007-0139830

(51) Int. Cl.
*G11C 7/10*   (2006.01)
(52) U.S. Cl. ........................ 365/189.16; 365/189.05; 365/219; 365/193; 365/194; 365/233.13; 365/233.16
(58) Field of Classification Search ............ 365/233.13, 365/233.16, 233.19, 233.1, 189.16, 189.05, 365/219, 220, 221, 193, 194, 191
See application file for complete search history.

(56) References Cited

U.S. PATENT DOCUMENTS

| | | | | |
|---|---|---|---|---|
| 6,003,118 | A * | 12/1999 | Chen | ......................... 711/167 |
| 6,115,322 | A * | 9/2000 | Kanda et al. | ........... 365/233.14 |
| 6,707,723 | B2 * | 3/2004 | Jeong | .................... 365/189.05 |
| 6,859,414 | B2 | 2/2005 | Koo | |
| 7,020,031 | B2 | 3/2006 | Shin et al. | |
| 7,209,396 | B2 | 4/2007 | Schnell | |
| 2007/0127296 | A1 | 6/2007 | Cha | |
| 2009/0168547 | A1 * | 7/2009 | Lee | ....................... 365/189.05 |

FOREIGN PATENT DOCUMENTS

KR    1020070107976 A    11/2007

* cited by examiner

*Primary Examiner*—Andrew Q Tran
(74) *Attorney, Agent, or Firm*—Baker & McKenzie LLP

(57) ABSTRACT

A data input circuit for a semiconductor memory apparatus includes a data latch block that, according to a data strobe signal, latches data and outputs the latched data; a data output controlling unit that determines a phase difference between the data strobe signal and a clock signal, and activates a data output control signal; and a data delay block that, when the data output control signal is activated, delays the data output from the data latch block for a predetermined time, and outputs the delayed data.

14 Claims, 5 Drawing Sheets

DATA INPUT CIRCUIT FOR A SEMICONDUCTOR MEMORY CAPABLE OF ADAPTING TO A PHASE SKEW BETWEEN A DATA STROBE SIGNAL AND AN EXTERNAL CLOCK SIGNAL

CROSS-REFERENCES TO RELATED APPLICATION

The present application claims priority under 35 U.S.C. 119(a) to Korean application number 10-2007-0139830, filed on Dec. 28, 2007, filed in the Korean Intellectual Property Office, which is incorporated by reference in its entirety as if set forth in full.

BACKGROUND

1. Technical Field

The embodiments described herein relate to a semiconductor memory apparatus, and in particular, to a data input circuit for a semiconductor memory apparatus and a control method thereof.

2. Related Art

FIG. 1 is a block diagram illustrating a conventional data input circuit for a semiconductor memory apparatus As shown in FIG. 1, the conventional data input circuit includes an input buffer 10 and a data latch unit 20.

The input buffer 10 receives and buffers data 'DATA_IN' and outputs the buffered data.

The data latch unit 20 includes a plurality of latches. The data latch unit 20 latches the data output from the input buffer 10 according to a first data strobe signal synchronous pulse 'DQSRP4' and a second data strobe signal synchronous pulse 'DQSFP4', and outputs aligned data 'ALGN_R1', 'ALGN_R0', 'ALGN_F1', and 'ALGN_F0'.

The first data strobe signal synchronous pulse 'DQSRP4' is generated so as to be synchronized with the rising edge of a data strobe signal 'DQS', which is generated outside of the semiconductor memory apparatus. The second data strobe signal synchronous pulse 'DQSFP4' is generated so as to be synchronized with the falling edge of the data strobe signal 'DQS'.

FIG. 2 is a timing diagram illustrating the operation of a conventional data input circuit when the data strobe signal 'DQS' is received under normal conditions.

The input data 'DATA_IN' is input subsequent to an external write command WT, and is sequentially shifted according to the second data strobe signal synchronous pulse 'DQSFP4'.

A data clock signal 'DCLK' is generated for every two second data strobe signal synchronous pulses 'DQSFP4'. The data clock signal 'DCLK' is a signal that is used to write the aligned data 'ALGN_R1', 'ALGN_R0', 'ALGN_F1', and 'ALGN_F0' into memory cells included in the semiconductor memory device.

When two cycles of the clock signal 'CLK' (2 tCK) elapses after the input data 'DATA_IN' is received, an internal write operation is performed according to the data clock signal 'DCLK'. Here, (tCK) means one cycle of an external clock signal 'CLK'.

With respect to the aligned data 'ALGN_R1', 'ALGN_R0', 'ALGN_F1', and 'ALGN_F0', the setup time of the data clock signal 'DCLK' is (tSETUP), and the hold time of the data clock signal 'DCLK' is (tHOLD). A data input operation occurs when the data strobe signal 'DQS' is received. When the data strobe signal 'DQS' is received normally, then there is sufficient setup time (tSETUP) and hold time (tHOLD), and thus the data write operation is carried out normally. However, when the data strobe signal 'DQS' is received later than the rising edge of the external clock signal 'CLK', then there will now be sufficient setup time (tSETUP). In addition, when the data strobe signal 'DQS' is input earlier than the rising edge of the external clock signal 'CLK', then there will not be a sufficient hold time (tHOLD). In this case, the stability of the data write operation may be compromised. In particular, when the data strobe signal 'DQS' is input earlier than the rising edge of the external clock signal 'CLK', the stability of the data write operation may be significantly compromised.

FIG. 3 is a timing diagram illustrating the operation of the data input circuit when the data strobe signal 'DQS' is input too early.

When the data strobe signal 'DQS' is input earlier than the external clock signal 'CLK', that is, a difference between the data strobe signal 'DQS' and the external clock signal 'CLK' is (−0.35 tCK), the setup time (tSETUP) and becomes (0.45 tCK), and the hold time (tHOLD) becomes (0.1 tCK).

There are many cases in which a semiconductor memory module needs to operate with the data strobe signal 'DQS' while maintaining a minimum margin in the setup time (tSETUP) and the hold time (tHOLD). As such, the potential for the data strobe signal 'DQS' to be input earlier than the external clock signal 'CLK' goes up, which makes a data write error more likely.

SUMMARY

A data input circuit for a semiconductor memory apparatus that can suppress a data input error according to a change in input timing of a data strobe signal DQS, and a control method thereof is described herein.

According to one aspect, a data input circuit for a semiconductor memory apparatus includes a data latch block that, according to a data strobe signal, latches data and outputs the latched data, a data output controlling unit that determines a phase difference between the data strobe signal and a clock signal, and activates a data output control signal, and a data delay block that, when the data output control signal is activated, delays the data output from the data latch block for a predetermined time, and outputs the delayed data.

According to another aspect, a method of controlling a data input circuit for a semiconductor memory apparatus includes aligning sequentially input data in parallel according to a data strobe signal to generate parallel data, determining a phase difference between the data strobe signal and a clock signal, and delaying the aligned parallel data according to the determination result, and outputting the delayed parallel data.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIGS. 7 to 9 are timing charts illustrating the operation of a data input circuit according to an embodiment of the invention.

DESCRIPTION OF EXEMPLARY EMBODIMENT

A data input circuit configured in accordance with the embodiments described herein can suppress a data input error that occurs due to a change in input timing of a data strobe signal 'DQS'. Therefore, the performance of a semiconductor memory apparatus that includes such a data input circuit can be improved.

Figure 1:
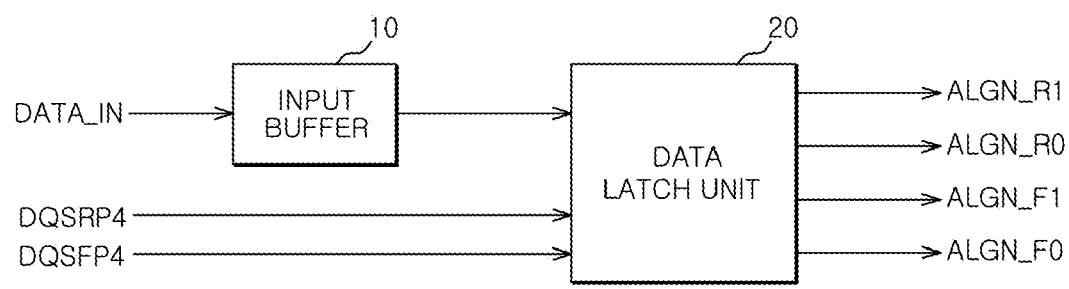
FIG. 1 is a block diagram illustrating a data input circuit for a semiconductor memory apparatus according to the related art.
Figure 2:
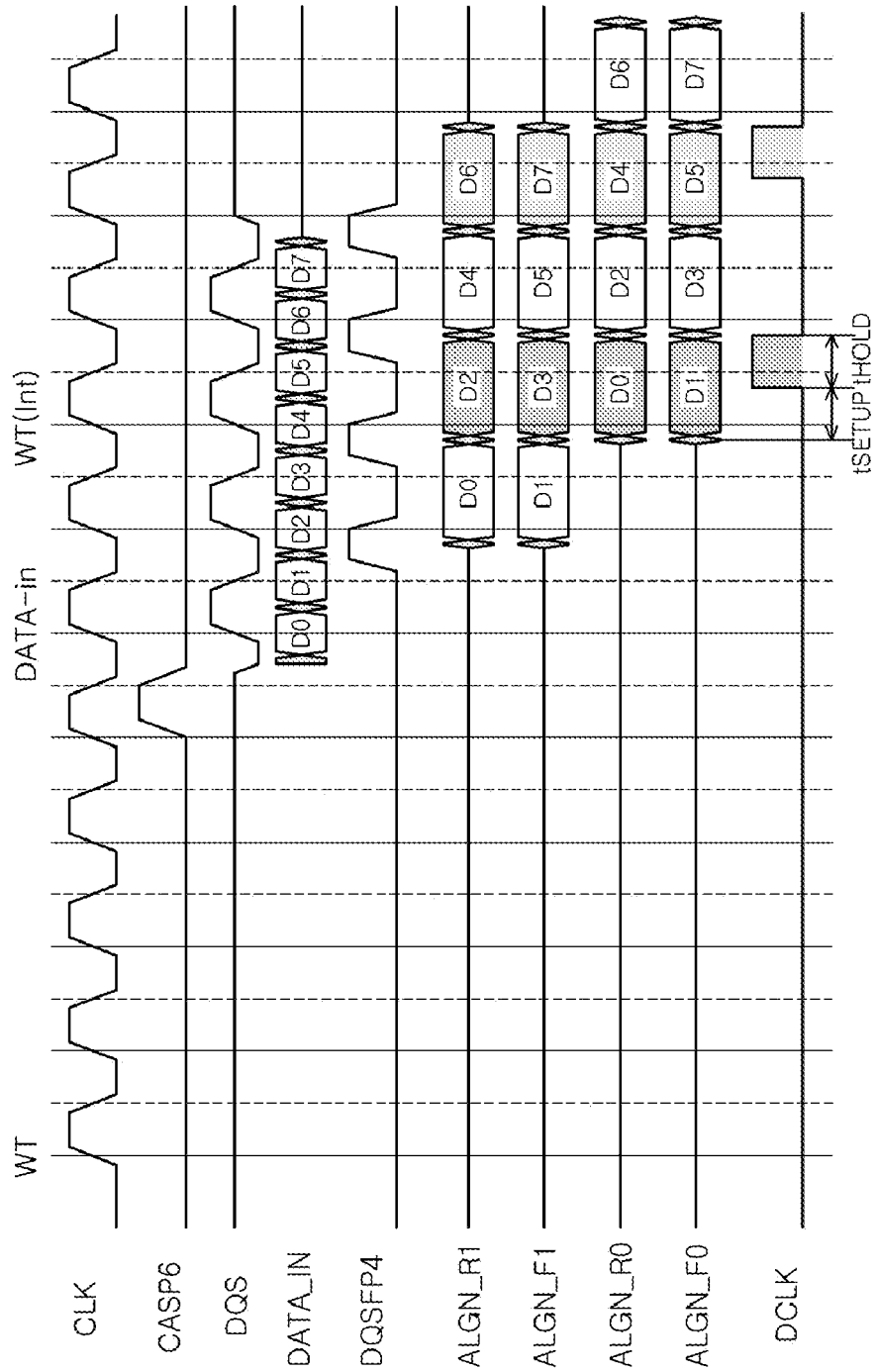
FIG. 2 is a timing chart illustrating the operation of a data input circuit according to the related art.
Figure 3:
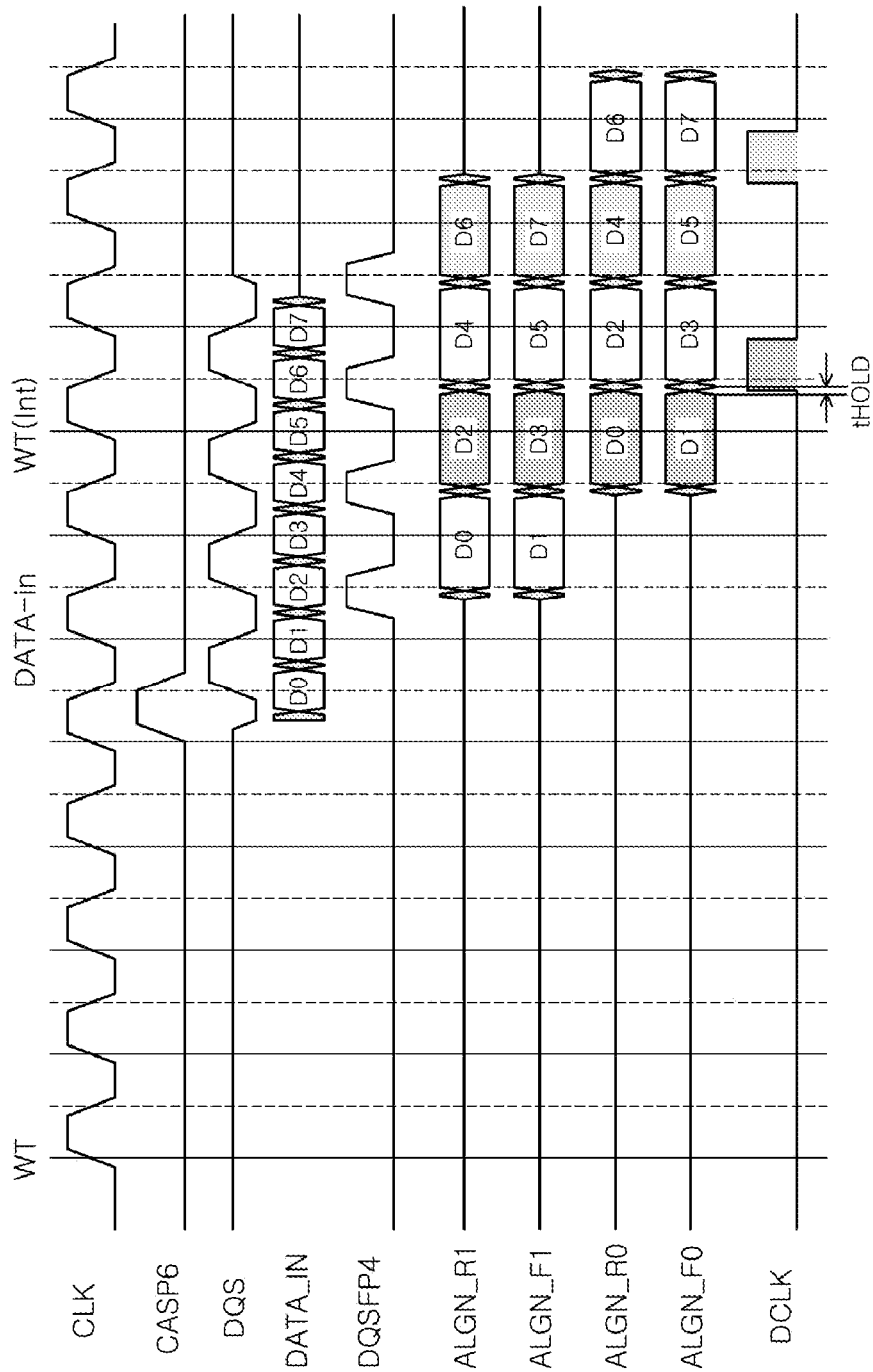
FIG. 3 is a timing chart illustrating the operation of a data input circuit according to the related art when a data strobe signal DQS is input earlier than that in the normal state.
Figure 4:
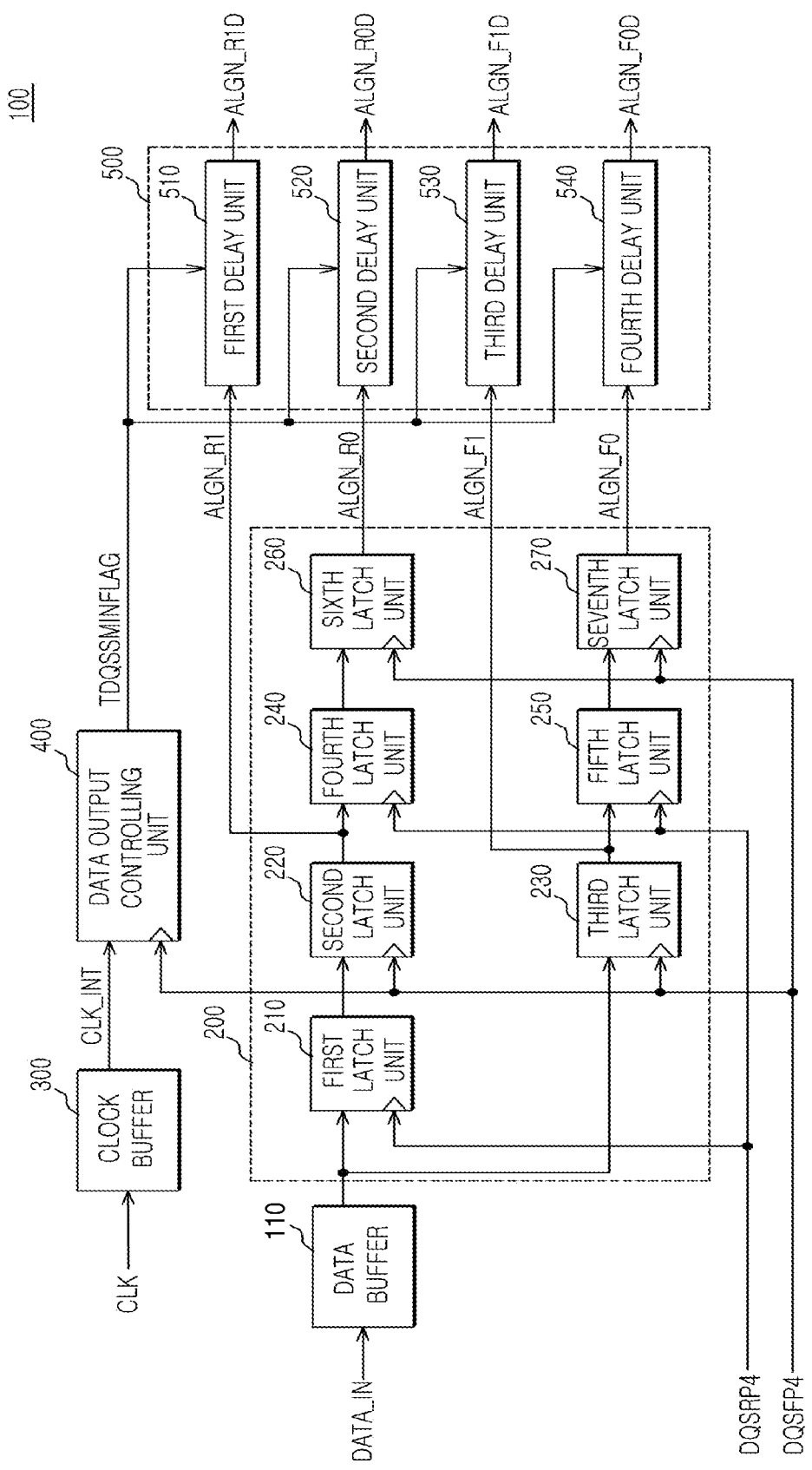
FIG. 4 is a block diagram illustrating a data input circuit for a semiconductor memory apparatus according to an embodiment of the invention.

FIG. 4 is a block diagram illustrating a data input circuit 100 configured in accordance with one embodiment. As shown in FIG. 4, the data input circuit 100 can includes a data buffer 110, a data latch block 200, a clock buffer 300, a data output controlling unit 400, and a data delay block 500.

The data buffer 110 can be configured to receive and buffer data signal 'DATA_IN', and output buffered data.

The data latch block 200 can include first to seventh latch units 210 to 270. The data latch block 200 can be configured to latch the data output from the data buffer 110 according to a first data strobe synchronous pulse signal 'DQSRP4' and a second data strobe synchronous pulse signal 'DQSFP4', and outputs aligned data 'ALGN_R1' 'ALGN_R0', 'ALGN_F1', and 'ALGN_F0'.

The first latch unit 210 can latch an output signal of the data buffer 110 according to the first data strobe synchronous pulse signal 'DQSRP4', and output the latched signal. The second latch unit 220 can latch an output signal of the first latch unit 210 according to the second data strobe synchronous pulse signal 'DQSFP4', and output the aligned data 'ALGN_R1'. The third latch unit 230 can latch an output signal of the data buffer 110 according to the second data strobe synchronous pulse signal 'DQSFP4', and output the aligned data 'ALGN_F1'. The fourth latch unit 240 can latch the aligned data 'ALGN_R1' according to the first data strobe synchronous pulse signal 'DQSRP4', and output the latched data. The fifth latch unit 250 can latch the aligned data 'ALGN_F1' according to the first data strobe synchronous pulse signal 'DQSRP4', and output the latched data. The sixth latch unit 260 can latch an output signal of the fourth latch unit 240 according to the second data strobe synchronous pulse signal 'DQSFP4', and output the aligned data 'ALGN_R0'. The seventh latch unit 270 can latch an output signal of the fifth latch unit 250 according to the second data strobe synchronous pulse signal 'DQSFP4', and output the aligned data 'ALGN_F0'.

The first data strobe synchronous pulse signal 'DQSRP4' can be a generated internally so as to be synchronized with the rising edge of a data strobe signal 'DQS', which is generated outside of the semiconductor memory apparatus. The second data strobe synchronous pulse signal 'DQSFP4' can be an internally generated pulse signal that is generated so as to be synchronized with the falling edge of the data strobe signal 'DQS'.

The clock buffer 300 can be configured to buffer an external clock signal 'CLK' and output an internal clock signal 'CLK_INT'.

The data output controlling unit 400 can be configured to determine whether or not the data strobe signal 'DQS' has a more advanced phase than that of the external clock signal 'CLK'. The data strobe signal 'DQS' and the external clock signal 'CLK' are input to the semiconductor memory apparatus. Accordingly, the data output controlling unit 400 can determine, according to the second data strobe synchronous pulse signal 'DQSFP4' and the internal clock signal 'CLK_INT', whether or not the data strobe signal 'DQS' has a more advanced phase than that of the external clock signal 'CLK', and generate a data output control signal 'TDQSSMINFLAG'.

The second data strobe synchronous pulse signal 'DQSFP4' can be synchronized with the falling edge of the data strobe signal 'DQS'. Additionally, the internal clock signal 'CLK_INT' can be generated from the external clock signal 'CLK' buffered by the clock buffer 300.

The data delay block 500 can include first to fourth delay units 510 to 540. The data delay block 500 can be configured to delay the aligned data 'ALGN_R1', 'ALGN_R0', 'ALGN_F1', and 'ALGN_F0' according to the data output control signal 'TDQSSMINFLAG' for a predetermined time, and output the delayed data. For example, when the data output control signal 'TDQSSMINFLAG' is deactivated, the data delay block 500 can output the aligned data 'ALGN_R1', 'ALGN_R0', 'ALGN_F1', and 'ALGN_F0' without delay. Meanwhile, when the data output control signal 'TDQSSMINFLAG' is activate, the data delay block 500 can delay the aligned data 'ALGN_R1', 'ALGN_R0', 'ALGN_F1', and 'ALGN_F0' for the predetermined time, and output the delayed data.

Figure 5:
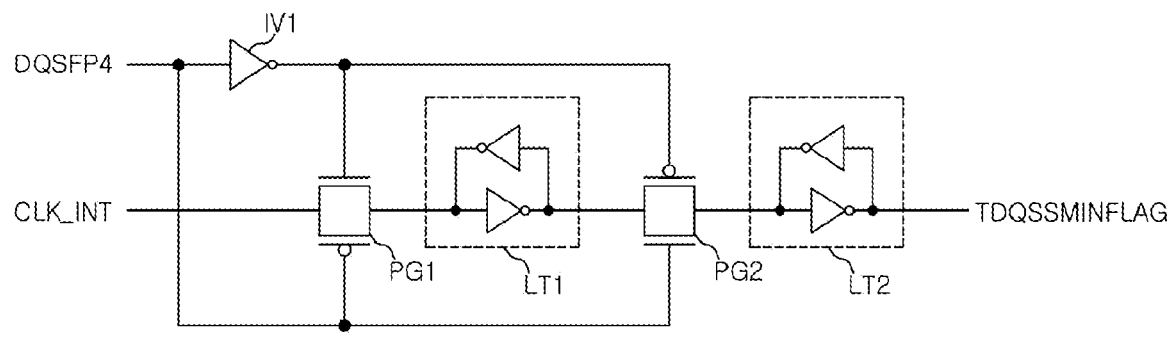
FIG. 5 is a circuit diagram illustrating a data output controlling unit shown in FIG. 4.

FIG. 5 is a circuit diagram illustrating the data output controlling unit 400 shown in FIG. 4 in more detail.

The data output controlling unit 400 can be configured to activate the data output control signal 'TDQSSMINFLAG', e.g., at a high level, when the internal clock signal 'CLK_INT' is, e.g., at a high level immediately before the rising edge of the second data strobe synchronous pulse signal 'DQSFP4'.

As shown in FIG. 5, the data output controlling unit 400 can include an inverter IV1, first and second pass gates PG1 and PG2, and first and second latches LT1 and LT2. The first inverter IV1 can receive the second data strobe synchronous pulse signal 'DQSFP4'. The first pass gate PG1 can have an input terminal to which the internal clock signal 'CLK_INT' is input, a first control terminal to which the second data strobe synchronous pulse signal 'DQSFP4' is input, and a second control terminal to which an output signal of the first inverter IV1 is input. The first latch LT1 can receive an output signal of the first pass gate PG1. The second pass gate PG2 can have an input terminal to which an output signal of the first latch LT1 is input, a first control terminal to which the output signal of the first inverter IV1 is input, and a second control terminal to which the second data strobe synchronous pulse signal 'DQSFP4' is input. The second latch LT2 can receive an output signal of the second pass gate PG2, and output the data output control signal 'TDQSSMINFLAG'.

Figure 6:
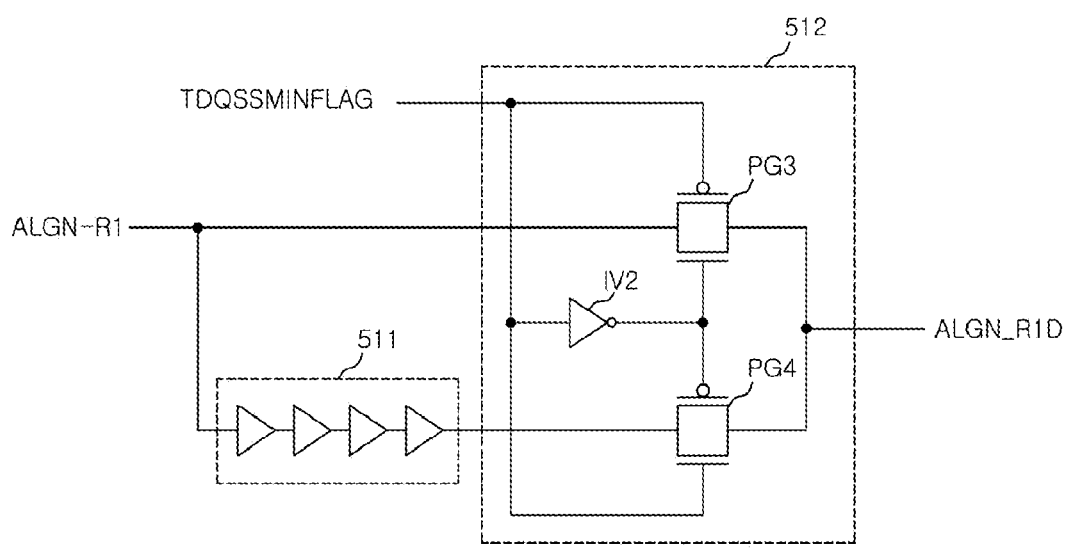
FIG. 6 is a circuit diagram illustrating a first delay unit shown in FIG. 4.

FIG. 6 is a circuit diagram illustrating the first delay unit 510 shown in FIG. 4. The first to fourth delay units 510 to 540 can have the same structure. Accordingly, only the first delay unit 510 will be described herein, and descriptions of the second to fourth delay units 520 to 540 will be omitted.

As shown in FIG. 6, the first delay unit 510 can include a delay circuit 511 and a selection circuit 512. The delay circuit

511 can include a delay element array to which the aligned data 'ALGN_R1' is input. The selection circuit 512 can include a second inverter IV2, and third and fourth pass gates PG3 and PG4. The second inverter IV2 can receive the data output control signal 'TDQSSMINFLAG'. The third pass gate PG3 can have an input terminal to which the aligned data 'ALGN_R1' is input, a first control terminal to which the data output control signal 'TDQSSMINFLAG' is input, and a second control terminal to which an output signal of the second inverter IV2 is input. The fourth pass gate PG4 can have an input terminal to which an output signal of the delay circuit 511 is input, a first control terminal to which the output signal of the second inverter IV2 is input, and a second control terminal to which the data output control signal 'TDQSSMINFLAG' is input. The third pass gate PG3 and the fourth pass gate PG4 can have a common output terminal from which aligned data 'ALGN_R1D'D' is output.

A method of controlling the data input circuit 100 for a semiconductor memory apparatus having the above-described structure will now be described with reference to FIGS. 7 to 9.

FIG. 7 is a timing diagram illustrating the operation of the data input circuit 100 when the data strobe signal 'DQS' is input after the external clock signal 'CLK' by (0.25 tCK). FIG. 8 is a timing diagram illustrating the operation of the data input circuit 100 when the data strobe signal 'DQS' is input before the external clock signal 'CLK' by (0.25 tCK). FIG. 9 is a timing diagram illustrating the operation of the data input circuit 100 when the data strobe signal 'DQS' is input earlier than the external clock signal 'CLK' by (0.35 tCK).

In the examples described here, the data signal 'DATA_IN' is input subsequent to an external write command 'WT'. The input data signal 'DATA_IN' is also sequentially shifted according to the second data strobe synchronous pulse signal 'DQSFP4'. The data clock signal 'DCLK' is generated for every two pulses of the second data strobe synchronous pulse signal 'DQSFP4'. The data clock signal 'DCLK' is a signal that is used to write the aligned data 'ALGN_R1', 'ALGN_R0', 'ALGN_F1', and 'ALGN_F0' into a memory cells.

When (2 tCK) elapses after the data 'DATA_IN' is input, an internal write operation can be carried out according to the data clock signal 'DCLK'.

Referring to FIG. 7, at the rising edge of the second data strobe synchronous pulse signal 'DQSFP4', the internal clock signal 'CLK_INT' is, e.g., at a low level. This means that the data strobe signal 'DQS' has a phase delayed from that of the external clock signal 'CLK'.

Accordingly, the data output controlling unit 400 shown in FIG. 5 latches the internal clock signal 'CLK_INT' at the rising edge of the second data strobe synchronous pulse signal 'DQSFP4', and outputs the deactivated data output control signal 'TDQSSMINFLAG', e.g., at a low level.

If the data output control signal 'TDQSSMINFLAG' is deactivated, then the first delay unit 510 shown in FIG. 6 selects and outputs the aligned data 'ALGN_R1' not passing through the delay circuit 511. The second to fourth delay units 520 to 540 also select and output the aligned data 'ALGN_R0', 'ALGN_F1', and 'ALGN_F0' not passing through the delay circuit 511, respectively.

As shown in FIG. 7, the aligned data 'ALGN_R1', 'ALGN_R0', 'ALGN_F1', and 'ALGN_F0' output from the data latch block 200, and data 'ALGN_R1D'D', 'ALGN_R0D', 'ALGN_F1D', and 'ALGN_F0D' output from the data delay block 500 have the same timing. A signal processing delay time of elements in the data delay block 500 is negligible.

For the data 'ALGN_R1D', 'ALGN_R0D', 'ALGN_F1D', and 'ALGN_F0D', a sufficient hold time (tHOLD) of the data clock signal 'DCLK' results, such that a normal data write operation can be carried out.

Referring to FIG. 8, at the rising edge of the second data strobe synchronous pulse signal 'DQSFP4', the internal clock signal 'CLK_INT' is, e.g., at a high level. This means that the data strobe signal 'DQS' has a more advanced phase than that of the external clock signal 'CLK'.

Accordingly, the data output controlling unit 400 shown in FIG. 5 latches the internal clock signal 'CLK_INT' at the rising edge of the second data strobe synchronous pulse signal 'DQSFP4', and outputs an activated data output control signal 'TDQSSMINFLAG', e.g., at a high level.

If the data output control signal 'TDQSSMINFLAG' is activated, then the first delay unit 510 shown in FIG. 6 selects and outputs delayed aligned data 'ALGN_R1' passing through the delay circuit 511. The second to fourth delay units 520 to 540 also select and output delayed aligned data 'ALGN_R0', 'ALGN_F1', and 'ALGN_F0' passing through the delay circuit 511, respectively.

As shown in FIG. 8, the aligned data 'ALGN_R1D', 'ALGN_R0D', 'ALGN_F1D', and 'ALGN_F0D' output from the data delay block 500 is delayed from the aligned data 'ALGN_R1', 'ALGN_R0', 'ALGN_F1', and 'ALGN_F0' output from the data latch block 200 for the delay time defined by the delay circuit 511 shown in FIG. 6.

At this time, when the aligned data 'ALGN_R1', 'ALGN_R0', 'ALGN_F1', and 'ALGN_F0' output from the data latch block 200 are used as in a conventional device, then the hold time (tHOLD) of the data clock signal 'DCLK' is significantly decreased, which makes it difficult to carry out a normal data write operation. In contrast, in a data input circuit configured according to the methods described herein, since the data 'ALGN_R1D', 'ALGN_R0D', 'ALGN_F1D', and 'ALGN_F0D' are used, the hold time (tHOLD) of the data clock signal 'DCLK' is sufficiently increased, as compared with a conventional approach, and the normal data write operation can be carried out.

Referring to FIG. 9, the input timing of the data strobe signal 'DQS' is faster by (0.1 tCK), as compared with FIG. 8. Accordingly, at the rising edge of the second data strobe synchronous pulse signal 'DQSFP4', the internal clock signal 'CLK_INT' is, e.g., at a high level. That is, as compared with FIG. 8, the data strobe signal 'DQS' has a much more advanced phase than that of the external clock signal 'CLK'.

Accordingly, the data output controlling unit 400 shown in FIG. 5 latches the internal clock signal 'CLK_INT' at the rising edge of the second data strobe synchronous pulse signal 'DQSFP4', and outputs an activated data output control signal 'TDQSSMINFLAG', e.g., at a high level.

If the data output control signal 'TDQSSMINFLAG' is activated, then the first delay unit 510 shown in FIG. 6 selects and outputs the delayed aligned data 'ALGN_R1' passing through the delay circuit 511. The second to fourth delay units 520 to 540 also select and output the delayed aligned data 'ALGN_R0', 'ALGN_F1', and 'ALGN_F0' passing through the delay circuit 511, respectively.

As shown in FIG. 9, the aligned data 'ALGN_R1D', 'ALGN_R0D', 'ALGN_F1D', and 'ALGN_F0D' output from the data delay block 500 is delayed from the aligned data 'ALGN_R1', 'ALGN_R0', 'ALGN_F1', and 'ALGN_F0' output from the data latch block 200 for the delay time defined by the delay circuit 511 shown in FIG. 6.

When the aligned data 'ALGN_R1', 'ALGN_R0', 'ALGN_F1', and 'ALGN_F0' output from the data latch block 200 are used according to conventional approach, the hold time (tHOLD) of the data clock signal 'DCLK' is further decreased, as compared with FIG. 8, and the data write operation itself may not be carried out. In contrast, using the approach described herein, the data 'ALGN_R1D', 'ALGN_R0D', 'ALGN_F1D', and 'ALGN_F0D' are used, the hold time (tHOLD) of the data clock signal 'DCLK' is sufficiently increased, as compared with the conventional approach, and thus a normal data write operation can be carried out.

As described above, in a data input circuit configured in accordance with the embodiments described herein, when it is detected that the data strobe signal 'DQS' is input earlier than the external clock signal 'CLK', data is accordingly delayed and output. Therefore, for the data, a sufficient hold time of the data clock signal 'DCLK' is secured. As a result, even if the generation timing of the data strobe signal 'DQS' is changed, a stable data write operation can be carried out.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A data input circuit for a semiconductor memory apparatus, the data input circuit comprising:
    a data latch block configured to sequentially latch data according to a data strobe signal and output parallel data;
    a data output controlling unit configured to activate a data output control signal according to a phase difference between the data strobe signal and a clock signal; and
    a data delay block configured to delay the data output from the data latch block for a predetermined time, and output the delayed data when the data output control signal is activated.

2. The data input circuit of claim 1, wherein the data latch block is further configured to sequentially latch input data according to one of a signal synchronized with the rising edge of the data strobe signal and a signal synchronized with the falling edge of the data strobe signal, and to output the latched data as parallel data.

3. The data input circuit of claim 2, wherein the data output controlling unit is further configured to determine the phase difference between the clock signal and the signal, synchronized with the falling edge of the data strobe signal.

4. The data input circuit of claim 3, wherein the data output controlling unit is further configured to generate the data output control signal by latching the clock signal at the rising edge of the signal synchronized with the falling edge of the data strobe signal.

5. The data input circuit of claim 4, wherein the data output controlling unit includes:
    a first pass element configured to pass the clock signal according to the signal, synchronized with the falling edge of the data strobe signal;
    a first latch element configured to latch an output signal of the first pass element;
    a second pass element configured to operate with a logic opposite to that of the first pass element to pass an output signal of the first latch element according to the signal synchronized with the falling edge of the data strobe signal; and
    a second latch element configured to latch an output signal of the second pass element.

6. The data input circuit of claim 3, wherein the data delay block includes a plurality of delay units each of which is configured to delay the parallel data output from the data latch block for the predetermined time in response to activation of the data output control signal.

7. The data input circuit of claim 6, wherein each of the plurality of delay units includes:
    a delay element configured to receive the parallel data;
    a first pass element configured to pass the parallel data according to the data output control signal; and
    a second pass element configured to operate with a logic opposite to that of the first pass element to pass an output signal of the delay element according to the data output control signal.

8. The data input circuit of claim 1, wherein the data output controlling unit is further configured to activate the data output control signal when the data strobe signal has a more advanced phase than that of the clock signal.

9. A method of controlling a data input circuit for a semiconductor memory apparatus, the method comprising:
    aligning sequentially input data in parallel according to a data strobe signal to generate parallel data;
    determining a phase difference between the data strobe signal and a clock signal; and
    delaying the aligned parallel data according to the determination result, and outputting the delayed parallel data.

10. The method of claim 9, wherein the aligning of sequentially input data in parallel according to the data strobe signal includes latching the sequentially input data multiple times according to a signal, which is synchronized with the rising edge of the data strobe signal and a signal, which is synchronized with the falling edge of the data strobe signal.

11. The method of claim 10, wherein the determining of the phase difference between the data strobe signal and the clock signal includes determining the phase difference between the clock signal and the signal, synchronized with the falling edge of the data strobe signal.

12. The method of claim 11, wherein the determining of the phase difference between the data strobe signal and the clock signal is carried out at the rising edge of the signal, synchronized with the falling edge of the data strobe signal.

13. The method of claim 12, wherein the clock signal is an internal clock signal that is generated by buffering an external clock signal.

14. The method of claim 9, wherein the delaying of the aligned parallel data according to the determination result and the outputting of the delayed parallel data includes delaying the aligned parallel data and outputting the delayed parallel data when the data strobe signal has a more advanced phase than that of the clock signal.

* * * * *